United States Patent
Shirakawa et al.

(10) Patent No.: US 6,843,335 B2
(45) Date of Patent: Jan. 18, 2005

(54) POWER CONVERSION APPARATUS AND MOBILE OBJECT INCORPORATING THEREOF

(75) Inventors: Shinji Shirakawa, Hitachi (JP); Akira Mishima, Mito (JP); Keiichi Mashino, Hitachinaka (JP); Toshiyuki Innami, Mito (JP); Shinichi Fujino, Mito (JP); Hiromichi Anan, Nishiibaraki-gun (JP); Yoshitaka Ochiai, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/024,338

(22) Filed: Dec. 21, 2001

(65) Prior Publication Data

US 2002/0195286 A1 Dec. 26, 2002

(30) Foreign Application Priority Data

Jun. 20, 2001 (JP) ........................................ 2001-185754

(51) Int. Cl.⁷ ................................................ B60K 1/00
(52) U.S. Cl. ...................... 180/65.1; 363/123; 363/132
(58) Field of Search .......................... 180/65.1; 363/40, 363/41, 123, 141, 131, 132, 144, 135, 136, 137; 361/687, 688, 707, 737, 637

(56) References Cited

U.S. PATENT DOCUMENTS

| | | | | |
|---|---|---|---|---|
| 5,365,424 A | * | 11/1994 | Deam et al. ................. | 363/144 |
| 5,544,038 A | | 8/1996 | Fisher et al. | |
| 5,623,399 A | * | 4/1997 | Ishii et al. ................... | 363/132 |
| 5,729,450 A | * | 3/1998 | Dimino et al. ............... | 363/132 |
| 6,115,270 A | * | 9/2000 | Yamane et al. ............... | 363/40 |
| 6,327,165 B1 | * | 12/2001 | Yamane et al. ............. | 363/132 |

FOREIGN PATENT DOCUMENTS

| | | |
|---|---|---|
| EP | 0553981 | 8/1993 |
| JP | 08140363 | 5/1996 |
| JP | 08-140363 | 5/1996 |
| JP | 11-089247 | 3/1999 |
| JP | 11089247 | 3/1999 |
| WO | 98/10508 | 3/1998 |

* cited by examiner

Primary Examiner—Christopher P. Ellis
Assistant Examiner—Kelly E Campbell
(74) Attorney, Agent, or Firm—Crowell & Moring LLP (57) ABSTRACT

A positive side conductor and a negative side conductor of an input terminal electrically connected to semiconductor elements, are electrically insulated from each other, and are laminated with each other, and the input terminal having such a laminated structure, an output terminal and substrates mounted thereon the semiconductor elements are arranged in a checkered pattern in a container. Further, the semiconductor elements mounted on the substrates, the input terminal and the output terminal are electrically connected to one another so as to obtain a loop-like electric path on a conductive member, thereby it is possible to aim at miniaturizing the power conversion apparatus and lowering the inductance thereof.

24 Claims, 6 Drawing Sheets

POWER CONVERSION APPARATUS AND MOBILE OBJECT INCORPORATING THEREOF

BACKGROUND OF THE INVENTION

The present invention relates to a power conversion apparatus for controlling electric power fed to a motor, and to a mobile object incorporating thereof.

RELATED ART

For example, Japanese Laid-Open Patent No. H8-140363 and Japanese Laid-Open Patent No. H11-89247 disclose power conversion apparatus which has been conventionally well-known. The former laid-open discloses such a configuration that a semiconductor element, a snubber capacitor, a DC bus and a smoothing capacitor are successively arranged one upon another on a cooling element in a laminated form so as to shorten the length of wiring in order to reduce the wiring inductance. Further, the latter laid-open discloses a wiring part between a capacitor and an inverter, having a such a structure that first to third planar conductors and first and second insulting sheets are alternately laminated one upon another in order to reduce the wiring inductance.

These years, for mobile objects having a motor as a drive source, including a motor driven vehicle such as an electric car or a hybrid automobile, there have been made investigations for miniaturizing a power conversion apparatus for converting a D.C. power fed from a battery into an A.C. power which is then fed to the motor in order to reduce the costs, enhance the fuel consumption and a travel distance per charge, and to miniaturize an mounting space for the apparatus, that is, it has been desired that a power conversion apparatus which is smaller than the above-mentioned conventional power conversion apparatus comes into a material.

Further, for a motor driven vehicle, since the control of electric current having a large capacity is required during driving of wheels only by a motor or during torque assist by a motor, there have been made investigations for reducing the inductance of the power conversion apparatus. That is, it has been desired that a power conversion apparatus which can have an inductance smaller than that of the above-mentioned conventional power conversion apparatus, comes into a material. Further, in view of the provision of a small-sized power conversion apparatus as mentioned above, it is desirable that a power conversion apparatus which can reduce the inductance with a small mounting area comes into a material.

SUMMARY OF THE INVENTION

A typical object of the present invention is to provide a power conversion apparatus which can aim at reducing its size, and also to provide a mobile object incorporating thereof. Further, another typical object of the present invention is to provide a power conversion device which can aim at allowing miniaturization of the apparatus and reduction of the inductance to consist with one another, and to provide a mobile object incorporating thereof.

The essential feature of the present invention is the provision of such an arrangement that a positive electrode conductor and a negative electrode conductor of an input terminal which is electrically connected to a semiconductor element are electrically insulated from each other and are laminated with one other so as to form lamination, and the input terminal, an output terminal and the substrates mounted thereon with semiconductor elements, in the form of the lamination, are arranged in a checkered pattern.

Specifically, two substrates, an output terminals and input terminal are arranged in a container so that two substrates are opposed to the input terminal and the output terminal, respectively, in different two directions, preferably in two orthogonal directions, on the respective conductor surfaces of the output and input terminals. Alternatively, two substrates, an output terminal and an input terminal are arranged in a container so that the output terminal is extended into the container from one of two opposed side surfaces of the container, and the input terminal is extended from the other one of the opposed side surfaces of the container, the input and output terminals are arranged diagonally, and further, two substrates are opposed respectively to the input terminal and the output terminal.

Further, in a general form, substrates, output terminals and input terminals are arranged in a container so that a plurality of substrates and the output terminals are alternately arranged in a first row while a plurality of substrates and the input terminals are alternately arranged in a second row, and the substrates in the first and second rows which are opposed to each other are arranged diagonally. Alternatively, substrates, output terminals and input terminals are arranged in a container so that a plurality of substrates and the output terminals, and a plurality of substrates and the input terminals are opposed to each other, being alternately arranged, and positions of the substrates and the terminals are staggered. Moreover, substrates, output terminals and input terminals are arranged in a container so that the output terminals which are extended inward from one of opposed walls of the container and the input terminals which are extended inward from the other one of opposed walls of the container are arranged in a staggered pattern, and the substrates on which semiconductor elements are mounted are arranged being opposed to the respective output terminals and the input terminals which are electrically connected to the semiconductor elements.

According to the present invention, since the substrates on which semiconductor elements are mounted, the input terminals which constitute a lamination and the output terminals are arranged in a checkered pattern in the container, the semiconductor elements and the input and outer terminals are arranged adjacent to one another so that the semiconductor element can be electrically connected to the input and output terminals, direct thereto, with no provision of additional conductor patterns on the substrates, thereby it is possible to reduce the area of main circuit wiring.

According to another essential features of the present invention, substrates on which semiconductor elements are mounted, input terminals and output terminals which are electrically insulated, are arranged in a checkered pattern on a conductive member in a container, and the semiconductor elements, the input terminals and the output terminals are electrically connected so as to form electric loop paths on the conductive member.

Specifically, two substrates, the output terminal and the input terminal which are electrically insulated are arranged on a conductive member in a container so that the two substrates, the output terminal and the input terminal are opposed in two directions on the respective conductive surfaces of the output terminal and input terminal, and respective semiconductor elements mounted on the substrates, the respective output and input terminals are electrically connected therebetween, in directions in which the two substrates and the respective output and input terminals are opposed to one another. Alternately, an output terminal extended from one of opposed side surfaces of a container, and an input terminal extended from the other one of the opposed side surfaces of the container which are electrically insulated, are diagonally arranged on a conductive member in the container, one of two substrates on which a conductor located on the upper side of the input terminals and semiconductor element electrically connected to the output terminal are mounted, and which is electrically insulated is arranged on a conductive member in the container, being opposed to the output terminal on the side inward of the container, and the input terminal, and further, the other one of substrates on which a conductor located on the lower side of the input terminal and a semiconductor element electrically connected to the output terminal are mounted, and which is electrically insulated is arranged on a conductive member in the container, being opposed to the output terminal and the input terminal on the side inward of the container.

Further, a plurality of substrates and a plurality of output terminals which are electrically insulated are alternately arranged in a first row on a conductive member, and a plurality of substrates and a plurality of output terminals which are electrically insulated are alternately arranged in a second row on the conductive member, the first and second rows being opposed to each other so that the substrates in the respective rows are diagonally arranged, and semiconductor elements mounted on the plurality of substrates, the plurality of output terminals and input terminals are divided into groups each consisting of semiconductors mounted on two substrates diagonally arranged, and input terminals and output terminals respectively opposed to the two substrates diagonally arranged, and in each of the group, semiconductor elements mounted on the two substrates diagonally arranged, are opposed respectively to the output terminals and the input terminals. Alternatively, substrates and output terminals, and substrates and output terminal, which are electrically insulated, are arranged on a conductive element in a container so that they are opposed to one another, and they are alternately arranged while the positions of the substrates and the terminals are staggered, and are divided into groups each consisting of semiconductor elements mounted on two substrates adjacent to each other in a direction of arrangement, and output terminals and input terminals which are electrically connected one another in directions of the arrangement and in opposed directions. Moreover, a plurality of output terminals extended from one of two opposed side surface of a container, inward of the container, and a plurality of input terminals extended from the other one of the opposed side surface of the container, inward of the container, which are electrically insulated, are arranged in a staggered pattern on a conductive element in a container, and of a plurality of substrates, those on which conductors located on the upper side of the input terminals and semiconductor elements connected to the output terminals are mounted, and which are electrically insulated are arranged on a conductive member in the container so as to be opposed to the associated output terminals on the side inward of the container, and the associated input terminals, and those on which conductors located on the lower side of the input terminals and semiconductor elements electrically connected to the output terminals are mounted and which are electrically insulated, are arranged on the conductive member in the container so as to be opposed to the associated output terminals and the associated input terminal on the side inward of the container.

According to the present invention, the substrates, the input terminals and the output terminals which are electrically insulated are arranged in a checkered pattern on the conductive member in the container, and the semiconductor elements mounted on the substrates are connected respectively to the input terminals and the output terminals so as to form electric loop paths on the conductive member, and accordingly, whenever the current value varies with time, eddy currents opposed to the electric loop paths are allowed to run through the conductive member. Further, the areas of the electric loop paths can be minimized.

Further, according to the present invention, the conductor laid on the lower side of the input terminals, that is, the negative side conductor is extended inward of the container by a length longer than that of the inward extension of the conductor laid on the upper side thereof, that is, the positive side conductor, and accordingly, the conductor laid on the lower side of the input terminals, that is, the negative side conductor can be electrically connected to the semiconductor elements in a relatively simple manner.

Explanation will be hereinbelow made of the present invention in the form of preferred embodiments with reference to the drawings.

DESCRIPTION OF PREFERRED EMBODIMENTS

As to a power conversion apparatus, there are used, for example, a rectifier for converting A.C. power into D.C. power, and an inverter for converting D.C. power into A.C. power, and DC—DC converter composed of a rectifier and an inverter, for converting inputted D.C. power into a desired D.C. power. In the embodiment of the present invention, explanation will be made of an inverter, as an example, for converting D.C. power fed from a battery, into A.C. power which is then fed to a motor in a vehicle such as an electric car using a motor as a sole drive source, a hybrid car using a drive source in combination of a motor and an internal combustion engine, or a motor driven four wheel drive vehicle in which either front wheels or rear wheels are driven by an internal combustion engine while the remainder is driven by a motor. It is noted that the configuration of this embodiment which will be hereinbelow made can be applied not only to an inverter but also to a rectifier or a DC—DC converter.

Figure 7:
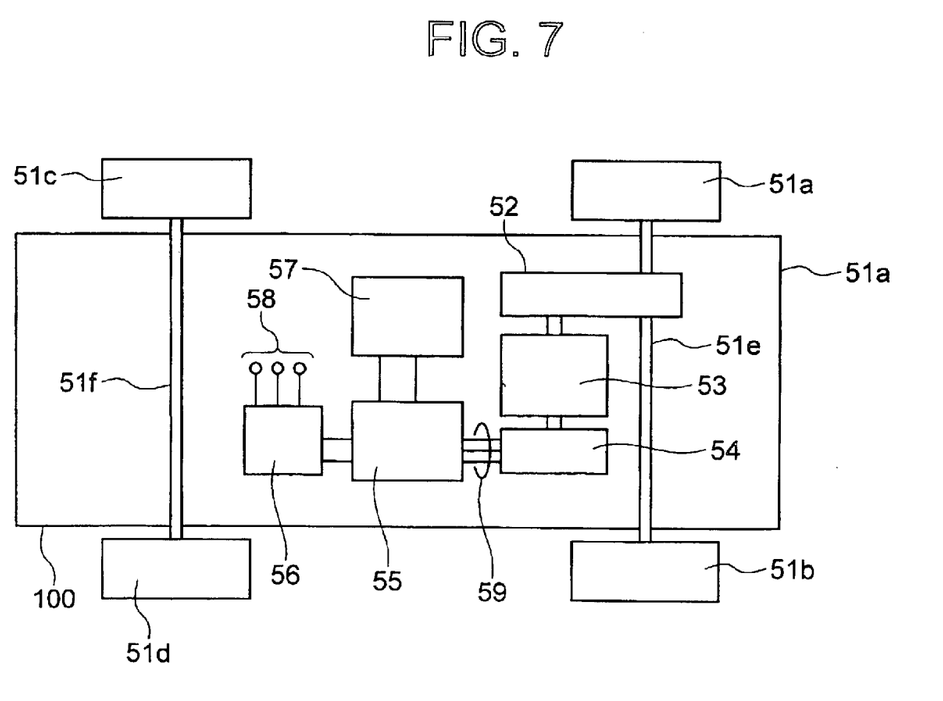
FIG. 7 is a block diagram schematically illustrating a configuration of a hybrid car.

Referring to FIG. 7 which shows an example of the configuration of an automobile to which an inverter in this embodiment of the present invention is applied, the automobile 100 is a hybrid car composed of an internal combustion engine 53, and a drive source which is an A.C. motor 54 such as an induction motor or a synchronous motor. An axle 51*e* provided at opposite ends with front wheels 51*a*, 51*b* is rotatably attached to the front part of a vehicle body 50, and an axle 51*f* provided at opposite ends with rear wheels 51*c*, 51*d* is rotatably attached to the rear part of the vehicle 50. The engine 53 is mechanically coupled to the axle 51*e* through the intermediary of a transmission mechanism, and the A.C. motor 54 is mechanically coupled to the engine 53.

D.C. power fed from a battery 57 is converted by an inverter 55 into three-phase A.C. power which is then fed through a power feeder 59. The inverter 55 receives a torque instruction signal and a current instruction signal from a control device such as an engine control device (ECU). The control device 55 computes a torque instruction value, a current instruction value and the like from signals such as signals indicating an operating condition of the vehicle, which are delivered by way of a signal terminal 58 and instruction signals demanded by the driver, that is a start signal, an acceleration signal, a deceleration signal or a stop signal, and delivers a torque instruction signal, a current instruction signal or the like. The inverter 55 which receives the torque instruction signal, the current instruction signal or the like, delivers a PWM (Pulse Width Modulation) signal so as to control the switching operation (turn-on and -off) of semiconductor elements in order to convert D.C. power fed from the battery 57 into three-phase A.C. power which is then fed to the A.C. motor 54. Thus, the A.C. motor 54 is driven.

In a hybrid car, during low load running such as starting or low speed running, wheels are driven only by a torque (output power) of the A.C. motor 54 while wheel drive by the engine 53 is stopped. Thus, the torque of the A.C. motor 54 is transmitted as a drive force to the axle 51*e* through the intermediary of the engine 53 and the transmission 52, and accordingly, the front wheels 51*a*, 51*b* are driven. During high load running such as acceleration, the wheel drive is carried out by both engine 53 and A.C. motor 54. Thus, the torque of the A.C. motor 54 is transmitted as an assist torque to the engine 53. During deceleration or stopping, the A.C. motor 54 is driven by the engine 53. Thus, the A.C. motor 54 generates A.C. power which is then converted into the inverter 55 into D.C. power that is fed to the battery 57.

In this embodiment, although explanation has been made of the hybrid car, an electric car in which only the A.C. motor 54 is used as a sole drive source, without the engine 53 shown in FIG. 7, may be used. Further, in the arrangement shown in FIG. 7, by mechanically connecting the A.C. motor 54 to the axle 51*f* through the intermediary of a transmission mechanism or providing an additional motor which is mechanically coupled to the axle 51*f* through the intermediary of the transmission mechanism, there may be provided a motor driven four wheel drive vehicle in which the front wheels can be driven by the engine and/or the A.C. motor 54 while the rear wheels are driven by the A.C. motor 54 or the additional motor.

Figure 5:
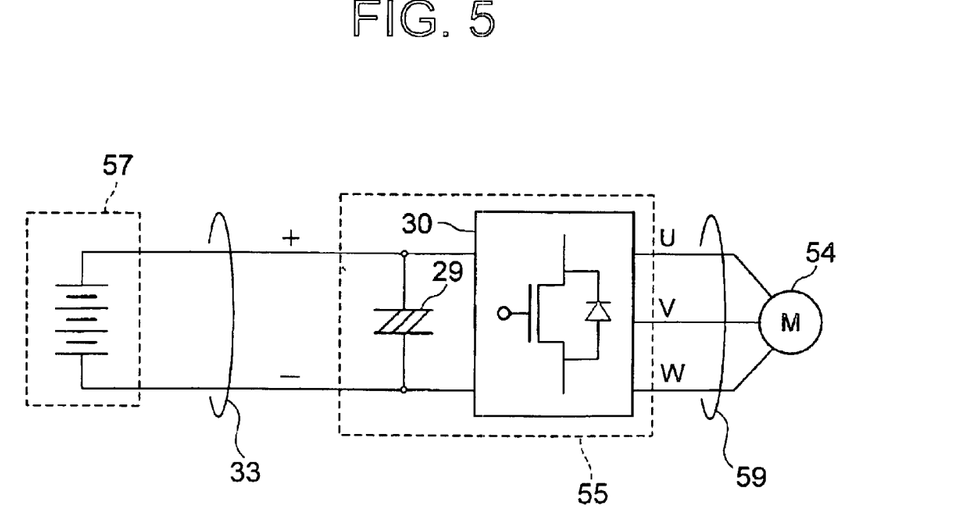
FIG. 5 is a block diagram illustrating a circuit configuration of the inverter device.

Referring to FIG. 5 which shows a circuit arrangement for the inverter 55 mounted on the vehicle 100 shown in FIG. 7. The inverter 55 is composed of a power module part 30 including an electrolytic capacitor 29, and a control part (which is not shown) for controlling switching (turn-on and -off) operation of semiconductor elements incorporated in the power module part 30. The power module part 30 is electrically connected on the input side thereof with the battery 57 through the intermediary of main circuit wiring 33 to which the electrolytic capacitor 29 as a capacitative element for restraining variation in D.C. voltage caused by switching operation of the semiconductor elements is electrically connected in parallel therewith. In this embodiment, although explanation has been made of the electrolytic capacitor as an example, any of capacitative elements which can perform the above-mentioned function may be used with no limitation to the electrolytic capacitor. The power module part 30 is electrically connected on the output side thereof with the A.C. motor 54 through three-phase output wiring 59 composed of a U-phase, V-phase and W-phase. In the inverter 55, D.C. power fed from the battery 57 by way of the main circuit wiring 33 is converted into three-phase A.C. power having variable frequency and variable voltage through switching operation of the semiconductor elements in the power module part 30, and the three-phase A.C. power is then fed to the A.C. motor 54 by way of the three-phase output wiring 59.

Figure 6:
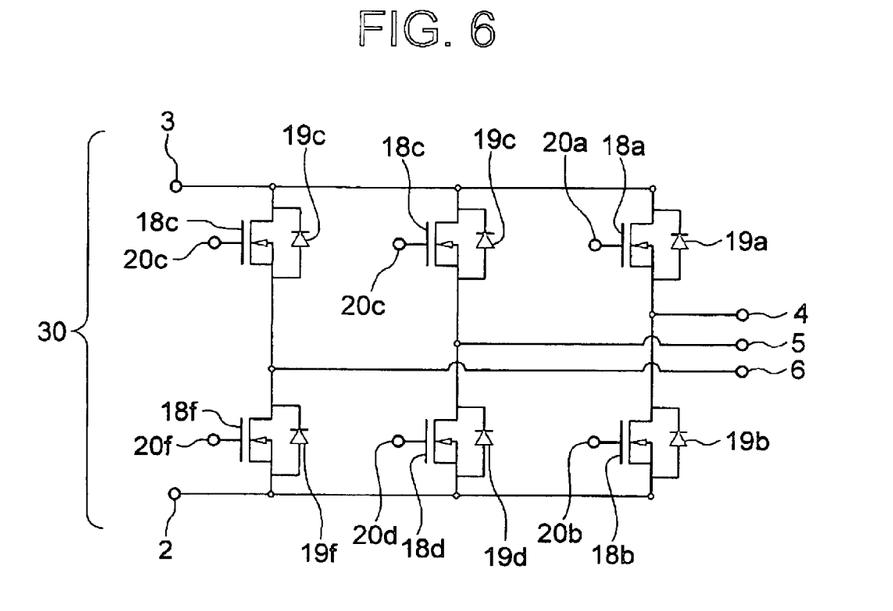
FIG. 6 is a block diagram illustrating a circuit configuration of the power module part of the inverter device.

Referring to FIG. 6 which is a circuit diagram illustrating the power module part 30, there are connected between a positive D.C. terminal 3 electrically connected to the battery and a negative D.C. terminal 2, a series circuit of a first circuit in which a semiconductor switch 18*a* and a diode 19*a* are connected in parallel with each other, and a second circuit in which a semiconductor switch 18*b* and a diode 19*b* are connected in parallel with each other, and a series circuit of a third circuit in which a semiconductor switch 18*c* and a diode 19*c* are connected in parallel to each other and a fourth circuit in which a semiconductor switch 18*d* and a diode 19*d* are connected in parallel with each other, and a series circuit of a fifth circuit in which a semiconductor switch 18*e* and a diode 19*e* are connected in parallel with each other and a sixth circuit in which a semiconductor switch 18*f* and a diode 19*f* are connected in parallel with each other, and accordingly, a three-phase bridge circuit is configured. A U-phase output terminal 4, a V-phase output terminal 5 and a W-phase output terminals are electrically connected respectively, between the first circuit and the second circuit, between the third circuit and the fourth circuit and between the fifth circuit and the sixth circuit.

In FIG. 6, there are shown a control terminal 20*a* provided to the semiconductor switch 18*a*, a control terminal 20*b* provided to the semiconductor switch 18*b*, a control terminal 20*c* provided to the semiconductor switch 18*c*, a control terminal 20*d* provided to the semiconductor switch 18*d*, a control terminal 20*e* provided to the semiconductor switch 18*e*, a control terminal 20*f* provided to the semiconductor switch 18*f*. Each of the semiconductor switches 18*a* to 18*f* delivers a terminal voltage between the control terminal and the negative side of the semiconductor switch, which serves as an actuating signal for switching operation. Accordingly, each of the semiconductor switches 18*a* to 18*f* is provided thereto with a negative side terminal which is not shown, in addition to the control terminal, and which is adapted to be connected to a drive circuit in the control part.

Each of the semiconductor switches 18*a*, 18*b*, 18*c*, 18*d*, 18*e*, 18*f* is composed of a power semiconductor element which is typically represented by, for example, MOS-FET (Metal Oxide Semiconductor Field Effect Transistor) or IGBT (Insulated Gate Bipolar Transistor). It is noted that MOS-FET includes a diode in its device structure, and accordingly, a semiconductor switch and a diode can be constituted in one chip. Accordingly, if the semiconductor switch is constituted with MOS-FET, it is possible to eliminate the necessity of mounting an additional diode. It is noted that the above-mentioned control terminal is referred to as a gate terminal.

Each of the control terminals 20a to 20f of the semiconductor switches 18a to 18f is applied thereto with a PWM control signal voltage for controlling the switching operation of the semiconductor switches 18a to 18f, from the drive circuit in the control part. This applied PWM control signal voltage controls the switching operation time, that is, the turn-on and -off operation time of each of the semiconductor switches 18a to 18f. Through this control, D.C. power fed from the battery is converted into three-phase A.C. powers in the bridge circuits, that is, a U-phase A.C. power through the bridge circuit consisting of the first and second circuits, V-phase A.C. power through the bridge circuit consisting of the third and fourth circuits, and W-phase A.C. power through the bridge circuit consisting of the fifth and sixth circuits. The converted U-phase A.C. power, the converted V-phase A.C. power and the converted W-phase A.C. power are fed to the A.C. motor 54 through the output terminals 4, 5, 6, respectively. Thus, the A.C. motor is driven.

It is noted that, as mentioned above, the A.C. motor 54 is driven by the engine as the case may be. In this case, the A.C. motor 54 generates three phase A.C. powers as it is driven. The three-phase A.C. powers thus generated are fed as regenerative electric powers to the bridge circuits through the intermediary of the output terminals for the respective phases, and are then converted into D.C. powers through the switching operation of the semiconductor switches 18a to 18f. The thus converted D.C. powers are fed to the battery through the intermediary of the positive D.C. terminal 3 and the negative D.C. terminal 2. That is, the battery is charged therein with the thus fed D.C. powers.

Figure 4:
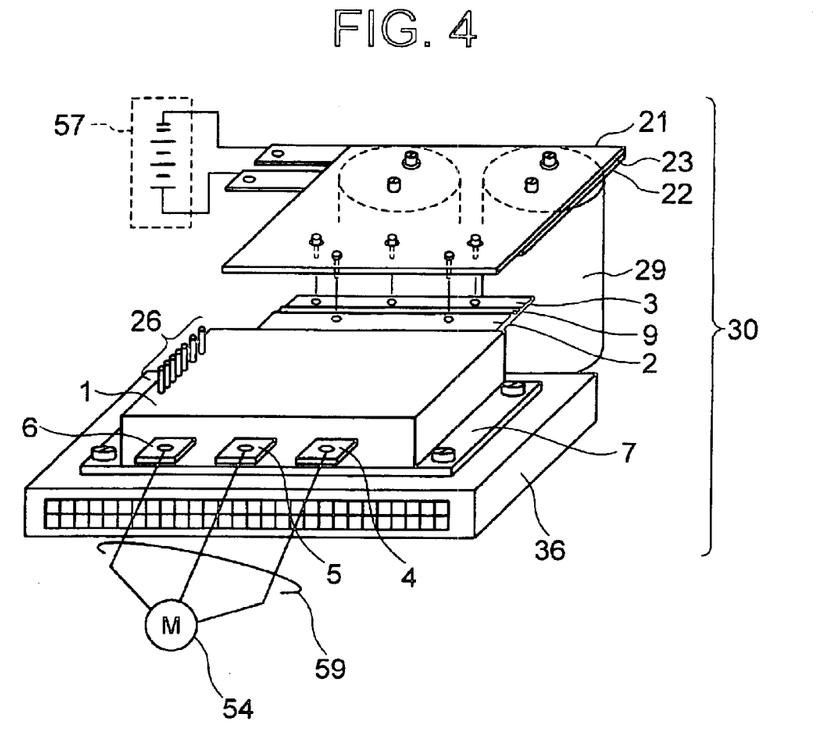
FIG. 4 is a perspective view illustrating an external configuration of the inverter device shown in FIG. 1.

Referring to FIG. 4 which shows an external configuration of an actual inverter 55 to which the circuit arrangement of the inverter 55 shown in FIG. 5 is applied, the inverter 55 is composed of a power module part (excluding the electrolytic capacitor 29), and a control part which are incorporated in one and the same closed container. An inverter casing 1 as the closed container is secured to conductor surfaces of cooling fins 36 as heat radiating elements, by fastening its bottom wall formed of a conductive heat radiation panel 7 with screws. Bar-like output terminals 4 to 6 are projected from one of opposed side surfaces of the inverter casing 1, and are extended outward. The output terminals 4 to 6 are electrically connected to the A.C. motor 54 by way of the output wiring (power cable) 59.

A planer input terminal is projected from the other one of the opposed side walls of the inverter casing 1, and is composed of the positive D.C. terminal 3 and the negative D.C. terminal 2 which are laminated with each other, a planer insulating member 9 being interposed therebetween. That is, the negative D.C. terminal 2 is laid underneath the insulating member 9, and the positive D.C. terminal 3 is laid just thereabove. The negative D.C. terminal 2 is extended outward of the inverter casing 1 by a length which is longer than that of the positive D.C. terminal 3. The input terminal is secured thereto with a laminated body composed of a planar conductor plate 21 and a planar conductor plate 22 which are laminated with each other with a planer insulating member 23 being interposed therebetween, by fastening with screws. The laminated body composed of the planar conductor plate 21, the planar conductor plate 22 and the planar insulating member 23 is attached thereto with the electrolytic capacitor 29 which are electrically connected to the conductor plates 22, 23. Further, the laminated body composed of the planar conductor plate 21, the planar conductor plate 22 and the planar insulating member 23 is electrically connected thereto with the battery.

A plurality of auxiliary control terminals 26 electrically connected to a circuit constituting a control part in the inverter casing 1 are projected from the top wall of the inverter casing 1, being extended outward from the inverter casing 1. The auxiliary control terminals 26 are electrically connected to a host control device such an engine control unit (ECU), and are used for receiving signals such as a torque instruction signal and a current instruction signal delivered from the host control device, and transmitting signals. The control part has a circuit board which is mounted thereon with several components including, for example, an interface circuit for inputting and outputting signals, a sensor circuit for detecting three phase A.C. power fed to the A.C. motor 54, a computer for carrying out computation in accordance with a torque instruction signal, a current instruction signal and the like delivered from the host control device, and delivering a PWM control signal, a drive circuit for increasing and decreasing the voltage of the PWM control signal delivered from the computer, and for delivering the same as a drive signal for switching operation of the semiconductor switches, and a control power source for supplying a drive power to the drive circuit, the sensor circuit, the computer and the interface circuit.

Figure 1:
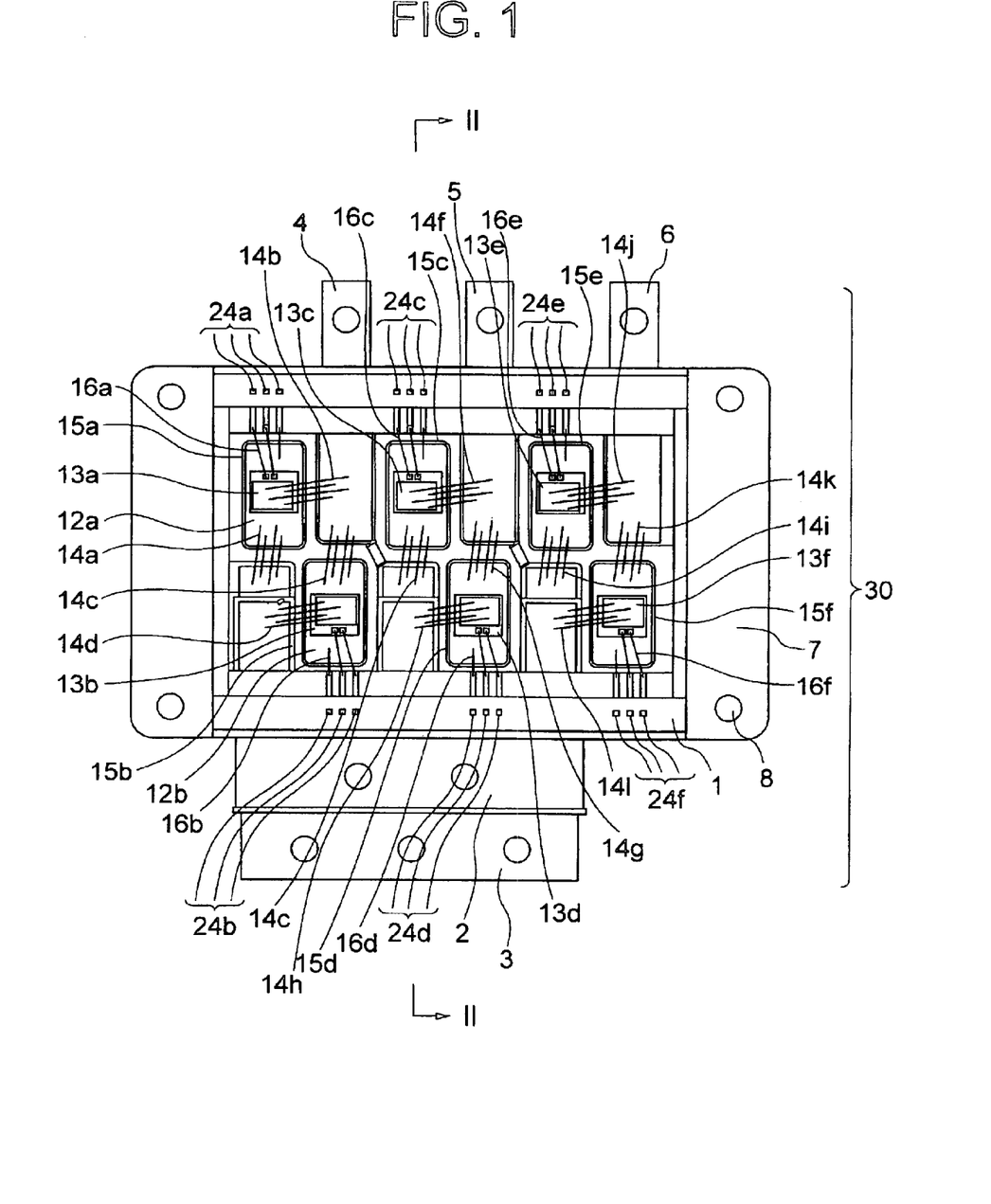
FIG. 1 is a plan view illustrating the configuration of an arrangement in a power module part of an inverter device in an embodiment of the present invention.
Figure 2:
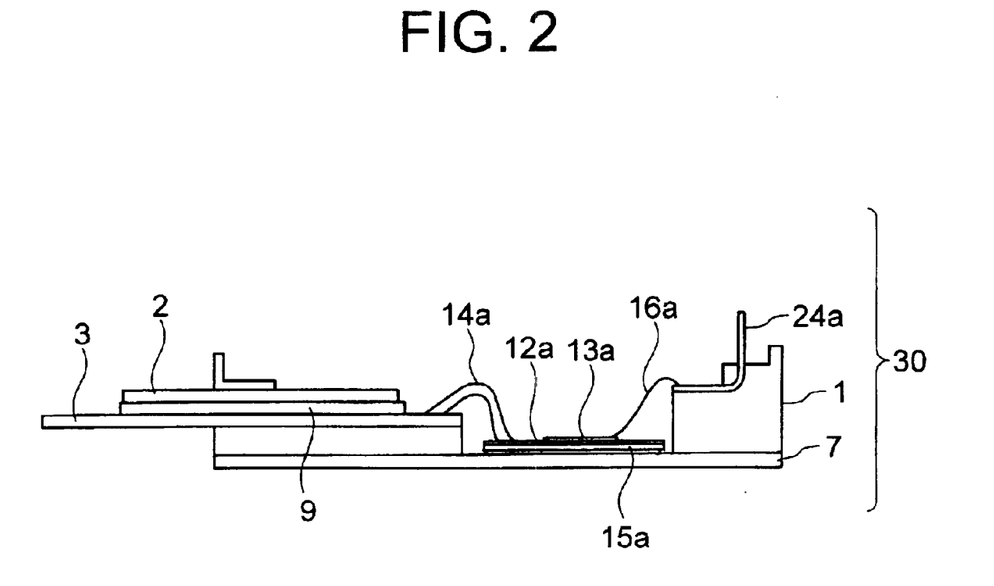
FIG. 2 is a sectional view along line II—II in FIG. 1.
Figure 3:
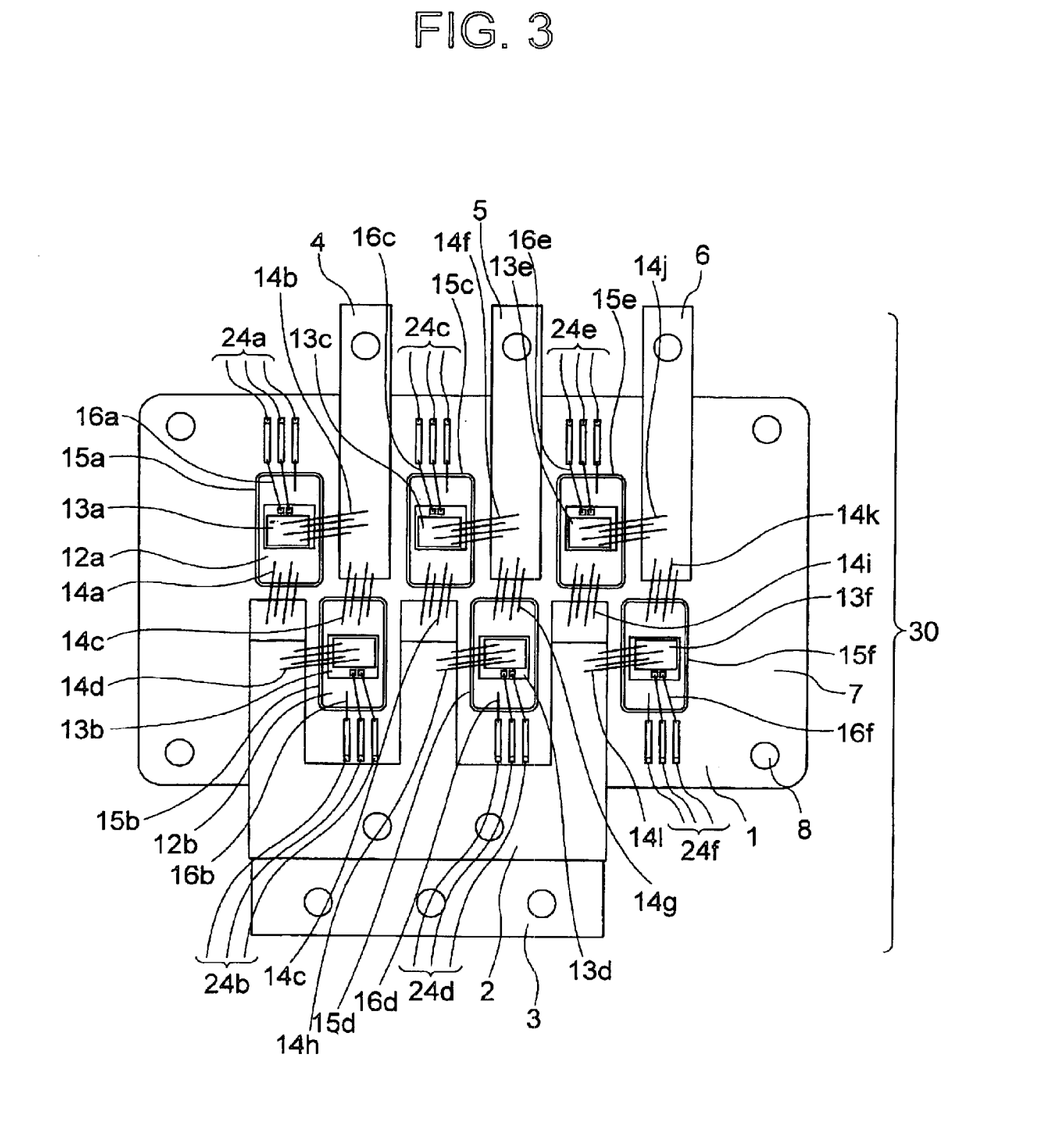
FIG. 3 is a plan view illustrating the configuration of the arrangement in the power module part of the inverter device shown in FIG. 1, in such a case that an inverter casing is removed therefrom.

Referring to FIGS. 1 to 3 which show the configuration of the power module part 30 of the inverter 55 in a first embodiment of the present invention, the bottom wall of an inverter casing 1 is formed of a conductive heat radiation panel 7 made of copper or Al—SiC alloy, four screw fastening holes are formed in opposite end parts of the heat radiation panel 7. Output terminals 4 to 6 are projected from one of opposed side walls of the inverter casing 1, and are extended inward of the inverter casing 1. An input terminal is projected from the other end of the opposite side walls of the inverter casing 1, and are extended inward of the inverter casing 1.

The input terminal is composed of a positive D.C. terminal 3 and a negative D.C. terminal 2 which are laminated with each other, an insulating member 9 being interposed therebetween, and is formed in a comb-like shape as shown in FIG. 3. With this arrangement, the comb-like input terminal has three digital parts projected inward of the inverter casing 1, and the body part (the base of the digital parts) of the input terminal is projected outward of the inverter casing 1. A negative D.C. terminal 2 laid underneath the three digital parts of the input terminal is extended inward of the inverter casing by a length which is longer than that of the positive D.C. terminal 3 laid just above the input terminal 2 in order to ensure wiring and connection as will be hereinbelow described.

The output terminals 4 to 6 and three digital parts of the input terminal which are projected inward of the inverter casing 1, are electrically insulated by the inverter casing 1 and diagonally arranged on the heat-radiation panel 7. An insulating substrate 15a is arranged in a part which is opposed to the extension side of a digital part of the input terminal that is located on the left side of the inverter casing 1, and which is adjacent to the output terminal 4, and an insulating substrate 15b is arranged in a part which is opposed to the extension side of the output terminal 4 and which is adjacent to digital parts of the input terminal that are located at the left side and the center of the inverter casing 1. Further, an insulator substrate 15c is arranged in a part which is opposed to the extension side of the digital part of the input terminal that is located at the center of the inverter casing 1, which is adjacent to the output terminals 4, 5. An insulating substrate 15d is arranged in a part which is opposed to the extension side of the output terminal 5 and which is adjacent to the digital parts of the input terminal which are located at the center and the right side of the inverter casing 1. An insulating substrate 15e is arranged in a part which is opposed to the extension side of the digital part of the input terminal that is located on the right side of the inverter casing 1 which is adjacent to the output terminals 5, 6. An insulating substrate 15f is arranged in a part which is opposed to the extension side of the output terminal 6 and which is adjacent to the digital part of the input terminal that is located on the right side of the inverter casing 1.

The insulating substrate 15a is formed thereon with a substrate conductor pattern 12a on which a semiconductor switch 13a is mounted, and to which the semiconductor switch 13a is electrically connected. The substrate conductor pattern 12a is electrically connected thereto with the negative D.C. terminal 2 of the digital part of the input terminal that is located on the left side of the inverter casing 1 through the intermediary of conductor wiring 14a. The semiconductor switch 13a is electrically connected thereto with the output terminal 4 through the intermediary of conductor wiring 14b.

The insulating substrate 15b is formed thereon with a substrate conductor pattern 12b on which a semiconductor switch 13b is mounted, and to which the semiconductor switch 13b is electrically connected. The substrate conductor pattern 12b is electrically connected thereto with the output terminal 4 through the intermediary of conductor wiring 14c. The semiconductor switch 13b is electrically connected thereto with the positive D.C. terminal 3 of the digital part of the input terminal that is located on the left side of the inverter casing 1, through the intermediary of conductor wiring 14d.

The electrical connection between the semiconductor switches 13a, 13b and the substrate conductor patterns 12a, 12b by means of the conductor wirings 14a, 14b, 14c, 14d constitutes the U-phase bridge circuit, and accordingly, D.C. power fed from the digital part of the input terminal that is located on the left side of the inverter casing 1, is converted into U-phase A.C. power through the switching operation of the semiconductor switches 13a, 13b, and the U-phase A.C. power is then delivered from the output terminal 4 to the U-phase of the A.C. motor 54.

The insulating substrate 15c is formed thereon with a substrate conductor pattern 12c on which a semiconductor switch 13c is mounted, and to which the semiconductor switch 13c is electrically connected. The substrate conductor pattern 12c is electrically connected thereto with the negative D.C. terminal 2 of the digital part of the input terminal that is located at the center of the inverter casing 1 through the intermediary of conductor wiring 14e. The semiconductor switch 13c is electrically connected thereto with the output terminal 5 through the intermediary of conductor wiring 14f.

The insulating substrate 15d is formed thereon with a substrate conductor pattern 12d on which a semiconductor switch 13d is mounted, and to which the semiconductor switch 13b is electrically connected. The substrate conductor pattern 12d is electrically connected thereto with the output terminal 5 through the intermediary of conductor wiring 14g. The semiconductor switch 13d is electrically connected thereto with the positive D.C. terminal 3 of the digital part of the input terminal that is located at the center of the inverter casing 1, through the intermediary of conductor wiring 14h.

The electrical connection between the semiconductor switches 13c, 13d and the substrate conductor patterns 12c, 12d by means of the conductor wirings 14e, 14f, 14g, 14h constitutes the V-phase bridge circuit, and accordingly, D.C. power fed from the digital part of the input terminal that is located at the center of the inverter casing 1, is converted into V-phase A.C. power through the switching operation of the semiconductor switches 13c, 13d, and the V-phase A.C. power is then delivered from the output terminal 5 to the V-phase of the A.C. motor 54.

The insulating substrate 15e is formed thereon with a substrate conductor pattern 12e on which a semiconductor switch 13e is mounted, and to which the semiconductor switch 13e is electrically connected. The substrate conductor pattern 12e is electrically connected thereto with the negative D.C. terminal 2 of the digital part of the input terminal that is located on the right side of the inverter casing 1 through the intermediary of conductor wiring 14i. The semiconductor switch 13e is electrically connected thereto with the output terminal 6 through the intermediary of conductor wiring 14j.

The insulating substrate 15f is formed thereon with a substrate conductor pattern 12f on which a semiconductor switch 13f is mounted, and to which the semiconductor switch 13f is electrically connected. The substrate conductor pattern 12f is electrically connected thereto with the output terminal 6 through the intermediary of conductor wiring 14k. The semiconductor switch 13f is electrically connected thereto with the positive D.C. terminal 3 of the digital part of the input terminal that is located on the right side of the inverter casing 1, through the intermediary of conductor wiring 14l.

The electrical connection between the semiconductor switches 13e, 13f and the substrate conductor patterns 12e, 12f by means of the conductor wirings 14i, 14j, 14k, 14l constitutes the W-phase bridge circuit, and accordingly, D.C. power fed from the digital part of the input terminal that is located on the right side of the inverter casing 1, is converted into W-phase A.C. power through the switching operation of the semiconductor switches 13e, 13f, and the W-phase A.C. power is then delivered from the output terminal 6 to the W-phase of the A.C. motor 54.

It is noted that although explanation has been made of such a case that the MOS-FET is used for the semiconductor switches, the above-mentioned configuration may also be obtained even with the use of IBT for the semiconductor switches. In the case of using the MOS-FET for the semiconductor switches, the surface to which the conductor wiring is connected is a source electrode surface while the surface to which the substrate conductor pattern is connected is a drain electrode surface. The surface the same as the source electrode surface is formed thereon with gate electrode surfaces for receiving a switching operation signal (turn-on and -off operation signal) from the semiconductor switch, and the like.

The side surface of the inverter casing 1 which is opposed to the insulating substrate 15a is provided with drive circuit substrate connection terminals 24a which are electrically connected to the drive circuit of the control part (not shown), and which are connected to the gate electrode surface of the semiconductor switch 13a through the intermediary of conductor wiring 16a. The side surface of the inverter casing 1 which is opposed to the insulating substrate 15b is provided with drive circuit substrate connection terminal 24b which are electrically connected to the drive circuit of the control part (not shown), and which are electrically connected to the gate electrode surface of the semiconductor switch 13b through the intermediary of conductor wiring 16b.

The side surface of the inverter casing 1 which is opposed to the insulating substrate 15c is provided with a drive circuit substrate connection terminals 24c which are electrically connected to the drive circuit of the control part (not shown), and which are connected to the gate electrode surface of the semiconductor switch 13c through the intermediary of conductor wiring 16c. The side surface of the inverter casing 1 which is opposed to the insulating substrate 15d is provided with drive circuit substrate connection terminals 24d which are electrically connected to the drive circuit of the control part (not shown), and which are electrically connected to the gate electrode surface of the semiconductor switch 13d through the intermediary of conductor wiring 16d.

The side surface of the inverter casing 1 which is opposed to the insulating substrate 15e is provided with drive circuit substrate connection terminals 24e which are electrically connected to the drive circuit of the control part (not shown), and which are connected to the gate electrode surface of the semiconductor switch 13e through the intermediary of conductor wiring 16e. The side surface of the inverter casing 1 which is opposed to the insulating substrate 15f is provided with drive circuit substrate connection terminals 24f which are electrically connected to the drive circuit of the control part (not shown), and which are electrically connected to the gate electrode surface of the semiconductor switch 13f through the intermediary of conductor wiring 16f.

It is noted that although explanation has been made of such a case that the semiconductor switch has two electrode surface while three drive circuit substrate connection terminals are used, the number of gate electrode surfaces should be increased if the semiconductor switch additionally has a current detecting function, a temperature detecting function and the like. Further, the number of the drive circuit substrate connection terminals must be increased in accordance with a number of gate electrode surfaces if voltage detection, temperature detection and the like are carried out.

According to this embodiment, since insulating substrates 15a to 15f, three digital parts of the comb-like input terminal and the output terminals 4 to 6 are alternately arranged in a checkered pattern, and are arranged on the heat radiation panel 7 in the inverter casing 1, the semiconductor switches 13a to 13f, the three digital parts of the comb-like input terminal and the output terminals can be electrically connected, directly there among, by conductor wiring with no extra substrate conductor pattern on the insulating substrates 15a to 15f, thereby it is possible to reduce the number of positions of connection of the conductor wiring. With this arrangement, the area of the main circuit wiring can be reduced so as to miniaturize the power module part 30. Thereby it is possible to miniaturize the inverter 55.

It is noted here that the main circuit wiring includes wiring which constitutes a bridge circuit between the negative D.C. terminal and the positive D.C. terminal of the input terminal with the use of the semiconductor switch, and wiring which connects the electrolytic capacitor between the negative D.C. terminal and the positive D.C. terminal of the input terminal.

In the case of using a low turn-on resistance type semiconductor switch as the semiconductor switch, a loss in the main circuit wiring is substantially equal to a loss cased by a turn-on resistance of the semiconductor switch. Accordingly, the reduction of the number of positions of wiring connection which dominates the the resistance of the main circuit wiring as mentioned above is effective for increasing the efficiency of power conversion. Further, the reduction of the number of positions of wiring connection results in reduction of manhours for wiring, thereby it is efficient for the reduction of production costs.

Further, although the connection among the negative D.C. terminal 2, the positive D.C. terminal 3, the output terminals 4 to 6 and the substrate conductor patterns 12a to 12f is made with the use of the conductor wirings 14a, 14c, 14e, 14g, 14i, 14j, it may be made with the use of thin plate-like conductors and with the use of solder joint or ultrasonic joint. With the connection using thin plate-like conductors, the manhours for the connection can be reduced in comparison with the conductor wiring connection. Further, the area of the connection with the use of thin plate-like conductors can be made to be larger, and accordingly, the wiring resistance can be reduced.

Further, according to this embodiment, the insulating member 9 interposed between the negative D.C. terminal and the positive D.C. terminal is held up to a position just before the joint surface of the negative d.c. terminal with respect to the conductor wiring, and accordingly, it is possible to reduce the wiring inductance in the negative D.C. electrode and the positive D.C. electrode 3.

Further, according to this embodiment, the inductance can be reduced by the configuration of arrangement of the output terminals 4 to 6, the comb-like input terminal and the insulating substrates 15a to 15f in the inverter casing 1. That is, in the inverter, the current value of the main circuit wiring largely varies upon change-over of the switching operation (turn-on and-off operation) of the semiconductor switch. Accordingly, a voltage (jump-up voltage) which is determined by the product of an inductance which is the sum of those of the main circuit wiring and the electrolytic capacitor, and a time-derivative value of a current value in the main circuit wiring is produced in the main circuit wiring. This jump-up voltage is instantly applied to the semiconductor switch together with the source voltage upon change-over of the switching operation of the semiconductor switch. If the jump-up voltage increases so that the voltage applied upon change-over of the switching operation of the semiconductor switch exceeds a proof-voltage thereof, the dielectric breakdown would be possibly caused. Thus, it is required to restrain the jump-up voltage during normal operation of the inverter. Accordingly, it is required to reduce the inductance which mainly causes occurrence of the jump-up voltage. The reduction of the inductance is specially important whenever the capacity of current in the inverter is increased.

Accordingly, in this embodiment, for example, the positive D.C. terminal 3 of the digital part of the input terminal which is located on the left side of the inverter casing 1, the conductor wiring 14d, the semiconductor switch 13b, the substrate conductor pattern 12b, the conductor wiring 14c, the output terminal 4, the conductor wiring 14b, the semiconductor switch 13a, the substrate conductor pattern 12a, the conductor wiring 14a and the negative D.C. terminal 2 of the digital part of the input terminal which is located on the left side of the inverter casing 1 are connected in the mentioned order so as to form a loop-like current path on the heat radiation panel 7. With this arrangement, when the current value varies with time, eddy current opposed to the loop-like current path runs through the heat radiation panel 7, and the inductance of the current path can be reduced due to magnetic interference with the eddy current.

Further, the smaller the area of the loop of the current path, the lower the inductance of the current path, the insulating substrates 15a to 15f, the three digital parts of the comb-like input terminal, and the output terminals 4 to 6 are alternately arranged in a checkered pattern on the heat radiation panel 7 in the inverter casing 1, and are electrically connected so as to constitute loop-like current paths each for each phase on the heat radiation panel 7, thereby it is possible to minimize the area of the loop-like current path.

Further, although the problem of the jump-up voltage can be solved by using a high proof-voltage semiconductor switch, the high proof voltage tends to cause the semiconductor switch to increase its resistance in a turn-on condition. In particular, in the case of such a system that the source voltage is low and a large volume of current runs through the semiconductor switch, the degree of loss in the semiconductor switch in a turn-on condition increases, and accordingly, the jump-up voltage caused by reduction of the inductance can be restrained by using a lower proof-voltage semiconductor switch. As a result, the use life, the reliability can be enhanced due to restraint to temperature rise which is caused by the reduction of heat generation, and the cooling costs can be reduced while the cooling device can be small-sized.

Further, with the configuration of the arrangement of the above-mentioned embodiment, the wiring direction of the conductor wiring connected to the gate electrode surface of the semiconductor switch, such as, the conductor wiring 16 can be set to an angle of about 90 deg. with respect to the wiring direction of the conductor wiring 14b, or set to be orthogonal to the latter, and accordingly, it is possible to reduce electromagnetic noise caused by current running through the conductor wiring 14b.

Figure 8:
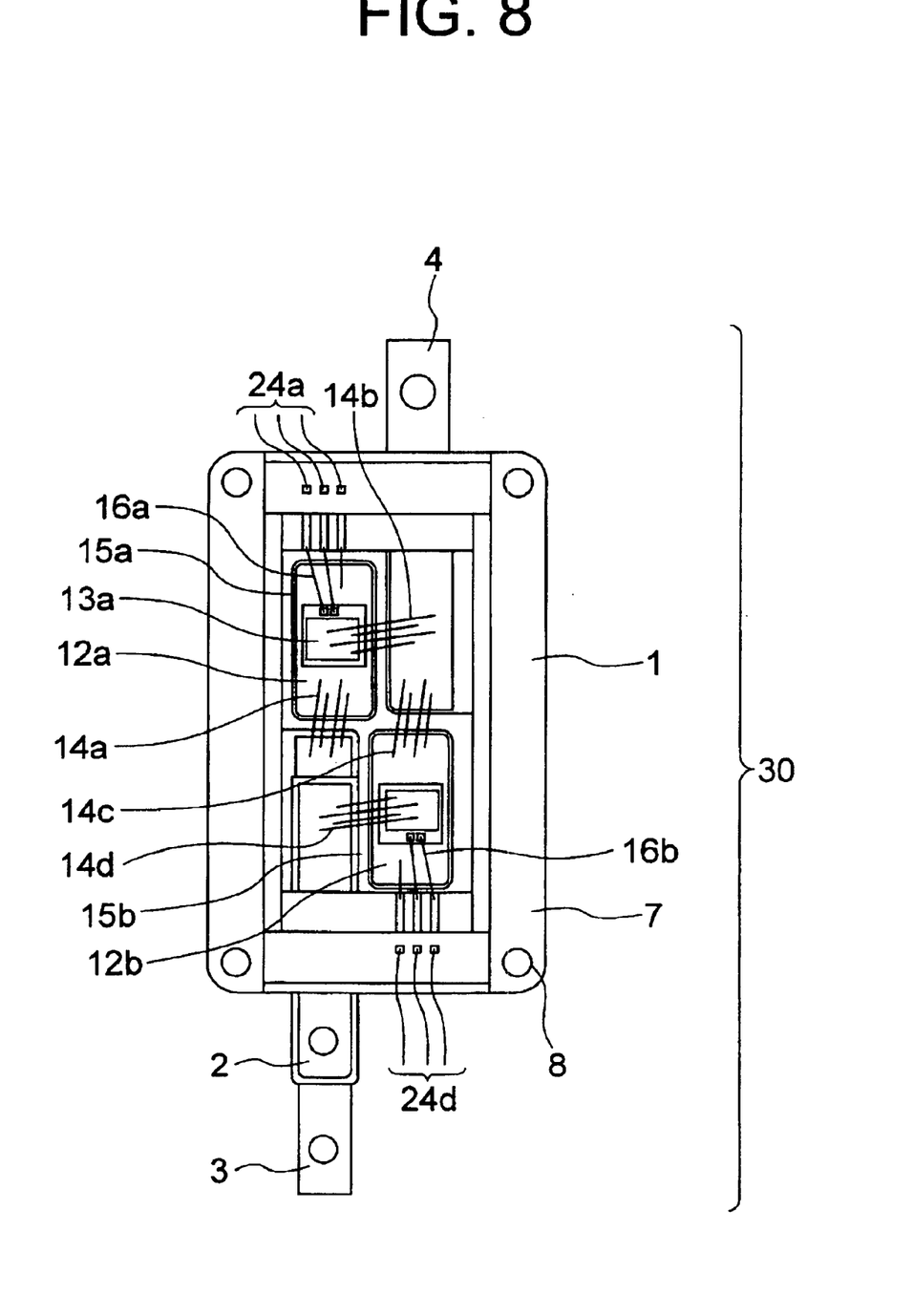
FIG. 8 is a plan view illustrating a configuration of an arrangement in an inverter device in a second embodiment of the present invention.

Referring to FIG. 8 which shows a configuration of arrangement in a power module of an inverter in a second embodiment of the present invention. Although the inverter for conversion of three-phase A.C. power has been explained in the first embodiment, the inverter in this embodiment is used for conversion of a single phase A.C. power, and accordingly, the configuration is completely the same as that for one (U-phase) of three phases of the inverter for conversion of the three-phase A.C. power in the first embodiment. In this embodiment, like reference numerals are used to denote like parts to those in the first embodiment, and accordingly, explanation thereto will be omitted. It is noted that in this embodiment, the positive D.C. terminal and the negative D.C. terminal constituting the input terminal are formed in a bar-like shape similar to that of the output terminals. With this arrangement, it is possible to miniaturize the inverter and reduce the inductance as is similar to the first embodiment.

According to the present invention, the area of the main circuit wiring can be reduced, and therefore it is possible to miniaturize the power conversion apparatus. Further, according to the present invention, since it is possible to cause eddy current opposed to a loop like electric path to run through a conductive member, the inductance of the power conversion apparatus can be reduce. Thus, with a mobile object incorporating a drive system on which the power conversion apparatus according to the present invention is installed, it is possible to aim at reducing the costs, enhancing the fuel consumption efficiency, enhancing the travel distance per electric charge, and reducing the mounting space of the apparatus. Further, large current control which is required during large torque output operation, that is, during wheel drive only by a motor, or during torque assist operation by the motor, can be made, thereby it is possible to smoothly run the mobile object upon staring.

What is claimed is:

1. A power conversion apparatus comprising a power module part having semiconductor elements for power control, and a control part for controlling the operation of the semiconductor elements, characterized in that the power module part includes two substrates mounted thereon the semiconductor elements, an output terminal adapted to be fed therethrough with an electric power controlled by the semiconductor elements and electrically connected to the semiconductor elements, an input terminal adapted to feed an electric power therethrough to the semiconductor elements so as to be controlled by the semiconductor elements and electrically connected to the semiconductor elements and composed of a positive side conductor and a negative side conductor which are laminated with each other being electrically insulate from each other, and a container for accommodating the two substrates, the output terminal and input terminal, at least in part, and the two substrates, the output terminal and the input terminal are arranged in the container so that the output terminal and the input terminal are opposed respectively to the two substrates in two different directions on the respective conductor surfaces of the output terminal and the input terminal.

2. A power conversion apparatus as set forth in claim 1, characterized in that the input terminals have the conductors located on the lower side thereof are extended inward by a length longer than that of the conductor located on the upper side thereof.

3. A power conversion apparatus as set forth in claim 2, characterized in that the conductor located on the lower side of the input terminal is a negative side conductor, and the conductor located on the upper side of the input terminal is a positive side conductor.

4. A power conversion apparatus comprising a power module part having semiconductor elements for power control, and a control part for controlling the operation of the semiconductor elements, characterized in that the power module part includes two substrates mounted thereon the semiconductor elements, an output terminal electrically connected to the semiconductor elements, an input terminal electrically connected to the semiconductor elements and composed of a positive side conductor and a negative side conductor which are laminated with each other being electrically insulate from each other, and a container for accommodating the two substrates, the output terminal and input terminal, at least in part, and the output terminal is extended from one of opposed side surfaces of the container inward of the container while the input terminal is extended from the other one of the opposed side surfaces of the container inward of the container, the output terminal and the input terminal being arranged diagonally in the container, and the two substrates are arranged in the container so that they are opposed to the output terminal and input terminal, respectively.

5. A power conversion apparatus as set forth in claim 4, characterized in that the input terminals have the conductors located on the lower side thereof are extended inward by a length longer than that of the conductor located on the upper side thereof.

6. A power conversion apparatus comprising a power module part having semiconductor elements for power control, and a control part for controlling the operation of the semiconductor elements, characterized in that the power module part includes two substrates mounted thereon the semiconductor elements, an output terminal adapted to be fed therethrough with an electric cower controlled by the semiconductor elements and electrically connected to the semiconductor elements, an input terminal adapted to feed therethrough an electric power to the semiconductor elements so as to be controlled by the semiconductor elements and electrically connected to the semiconductor elements and composed of a positive side conductor and a negative side conductor which are laminated with each other being electrically insulate from each other, and a container for accommodating the two substrates, the output terminal and input terminal, at least in part, and the two substrates, the output terminal and the input terminal are electrically insulated, and are arranged on a conductive member in the container so that the two substrates are opposed respectively to the output terminal and the input terminal, in two different directions on the respective conductor surfaces of the output and the input terminals, the semiconductor elements mounted on the two substrates, and the output terminal and the input terminals are electrically connected therebetween in directions in which the two substrates are opposed respectively to the output terminal and the input terminal.

7. A power conversion apparatus as set forth in claim 6, characterized in that the input terminals have the conductors located on the lower side thereof are extended inward by a length longer than that of the conductor located on the upper side thereof.

8. A power conversion apparatus comprising a power module part having semiconductor elements for power control, and a control part for controlling the operation of the semiconductor elements, characterized in that the power module part includes two substrates mounted thereon the semiconductor elements, an output terminal adapted to be fed therethrough with an electric power controlled by the semiconductor elements and electrically connected to the semiconductor elements, an input terminal adapted to feed therethrough an electric cower to the semiconductor elements so as to be controlled by the semiconductor elements and electrically connected to the semiconductor elements and composed of a positive side conductor and a negative side conductor which are laminated with each other being electrically insulate from each other, and a container for accommodating the two substrates, the output terminal and input terminal, at least in part, and the output terminal is extended from one of opposed side surfaces of the container inward of the container while the input terminal is extended from the other one of the opposed side surfaces of the container inward of the container, the output terminal and the input terminal being electrically insulated and arranged diagonally on a conductive member in the container, one of the two substrates on which a conductor located on the upper side the input terminal and a semiconductor element electrically connected to the output terminal are mounted is electrically insulated and is arranged on the conductive member so as to be opposed to the output terminal on the side inward of the container, and the output terminal, and the other one of the substrates on which a conductor located on the lower side of the input terminal and a semiconductor element electrically connected to the output terminal is electrically insulated and arranged on the conductive member so as to be opposed to the output terminal and the input terminal on the side inward of the container.

9. A power conversion apparatus as set forth in claim 8, characterized in that the input terminals have the conductors located on the lower side thereof are extended inward by a length longer than that of the conductor located on the upper side thereof.

10. A power conversion apparatus comprising a power module part having semiconductor elements for power control and a control part for controlling the operation of the semiconductor elements, the power module part being composed of substrates mounted thereon with the semiconductor elements, output terminals electrically connected to the semiconductor elements, input terminals electrically connected to the semiconductor elements and each composed of a positive side conductor and a negative side conductor which are laminated with each other being electrically insulated from each other, and a container for accommodating the plurality of the substrates, and the output terminals at least in part, and the input terminals at least in part, characterized in that a plurality of the substrates and the output terminals are alternately arranged in a first row, and a plurality of substrates and the input terminals are alternately arranged in a second row, and the first row and the second row is opposed to each other so that the substrates in these rows are diagonally arranged.

11. A power conversion apparatus as set forth in claim 10, characterized in that the input terminals have the conductors located on the lower side thereof are extended inward by a length longer than that of the conductor located on the upper side thereof.

12. A power conversion apparatus comprising a power module part having semiconductor elements for power control and a control part for controlling the operation of the semiconductor elements, the power module part being composed of substrates mounted thereon with the semiconductor elements, output terminals electrically connected to the semiconductor elements, input terminals electrically connected to the semiconductor elements and each composed of a positive side conductor and a negative side conductor which are laminated with each other being electrically insulated from each other, and a container for accommodating the plurality of the substrates, and the output terminals at least in part, and the input terminals at least in part, characterized in that the substrates, the output terminals and the input terminals are electrically insulated and arranged in the container so that a plurality of the substrates and the output terminal, and a plurality of the substrates and the input terminals are alternately arranged, being opposed to one another, and the positions of the substrates and the positions of the terminals are staggered to one another.

13. A power conversion apparatus as set forth in claim 12, characterized in that the input terminals have the conductors located on the lower side thereof are extended inward by a length longer than that of the conductor located on the upper side thereof.

14. A power conversion apparatus comprising a power module part having semiconductor elements for power control and a control part for controlling the operation of the semiconductor elements, the power module part being composed of substrates mounted thereon with the semiconductor elements, output terminals adapted to be fed therethrough with an electric power controlled by the semiconductor elements and electrically connected to the semiconductor elements, input terminals adapted to feed therethrough an electric power to the semiconductor elements so as to be controlled by the semiconductor elements and electrically connected to the semiconductor elements and each composed of a positive side conductor and a negative side conductor which are laminated with each other being electrically insulated from each other, and a container for accommodating the plurality of the substrates, and the output terminals at least in part, and the input terminals at least in part, characterized in that the output terminals are extended from one of opposed side surfaces of the container, and the input terminals are extended from the other one of the opposed side surfaces of the container, the output terminals and the input terminals being staggered with one another in the container, the substrates mounted thereon the semiconductor elements are arranged in the container so as to be opposed to the output terminals and the input terminals electrically connected to the semiconductor elements.

15. A power conversion apparatus as set forth in claim 14, characterized in that the input terminals have the conductors located on the lower side thereof are extended inward by a length longer than that of the conductor located on the upper side thereof.

16. A power conversion apparatus comprising a power module part having semiconductor elements for power control and a control part for controlling the operation of the semiconductor elements, the power module part being composed of substrates mounted thereon with the semiconductor elements, output terminals electrically connected to the semiconductor elements, input terminals electrically connected to the semiconductor elements and each composed of a positive side conductor and a negative side conductor which are laminated with each other being electrically insulated from each other, and a container for accommodating the plurality of the substrates, and the output terminals at least in part, and the input terminals at least in part, characterized in that the substrates a plurality of the substrates and the output terminals are alternately arranged in a first row, and a plurality of substrates and the input terminals are alternately arranged in a second row, and the first row and the second row is opposed to each other so that the substrates in these rows are diagonally arranged, the semiconductor elements mounted on the substrates, the output terminals and the input terminals are divided into groups each composed of semiconductor elements mounted on two substrates diagonally arranged, and output and input terminals respectively opposed to the two substrates diagonally arranged, and in each of the groups, the two substrates, and the input terminals and the output terminals are electrically connected in the directions in which they are opposed to one another.

17. A power conversion apparatus as set forth in claim 16, characterized in that the input terminals have the conductors located on the lower side thereof are extended inward by a length longer than that of the conductor located on the upper side thereof.

18. A power conversion apparatus comprising a power module part having semiconductor elements for power control and a control part for controlling the operation of the semiconductor elements, the power module part being composed of substrates mounted thereon with the semiconductor elements, output terminals electrically connected to the semiconductor elements, input terminals electrically connected to the semiconductor elements and each composed of a positive side conductor and a negative side conductor which are laminated with each other being electrically insulated from each other, and a container for accommodating the plurality of the substrates, and the output terminals at least in part, and the input terminals at least in part, characterized in that the substrates, the output terminals and the input terminals are electrically insulated and arranged on a conductive member in the container so that the substrates, the output terminals, and the input terminals are electrically insulated and arranged on a conductive member in the container, and accordingly, a plurality of the substrates and the output terminals, and a plurality of the substrates and the input terminals are alternately arranged, respectively, the positions of the substrates and the positions of the terminals being staggered with each other, the semiconductor elements mounted on the substrates, the output terminals and the input terminals are divided into groups each composed of semiconductor elements mounted on two substrates diagonally arranged, and output and input terminals respectively opposed to the two substrates diagonally arranged, and in each of the groups, the two substrates, and the input terminals and the output terminals are electrically connected in the directions in which they are arranged and in which they are opposed to one another.

19. A power conversion apparatus as set forth in claim 18, characterized in that the input terminals have the conductors located on the lower side thereof are extended inward by a length longer than that of the conductor located on the upper side thereof.

20. A power conversion apparatus comprising a power module part having semiconductor elements for power control and a control part for controlling the operation of the semiconductor elements, characterized in that the power module part being composed of substrates mounted thereon with the semiconductor elements, output terminals adapted to be fed therethrough with an electric cower controlled by the semiconductor elements and electrically connected to the semiconductor elements, input terminals adapted to feed therethrough an electric power to the semiconductor elements so as to be controlled by the semiconductor elements and electrically connected to the semiconductor elements and each composed of a positive side conductor and a negative side conductor which are laminated with each other being electrically insulated from each other, and a container for accommodating the plurality of the substrates, and the output terminals at least in part, characterized in that the input terminals at least in part, and the output terminals are extended from one of opposed side surfaces of the container, and the input terminals are extended from the other one of the opposed side surfaces of the container, the output terminals and the input terminals being electrically insulated and staggered with one another on a conductive member in the container, those of the substrates mounted thereon with conductors located on the upper side of the input terminals and semiconductor elements electrically connected to the output terminals are electrically insulated and arranged on the conductive member so as to be opposed to the associated output terminals on the side inward of the container, and the associated input terminals, and those of the substrates mounted thereon with conductors located on the lower side of the input terminals and semiconductor elements electrically connected to the output terminals are electrically insulated and arranged on the conductive member so as to be opposed to the associated output terminals and the associated input terminals on the side inward of the container.

21. A power conversion apparatus as set forth in claim 20, characterized in that the input terminals have the conductors located on the lower side thereof are extended inward by a length longer than that of the conductor located on the upper side thereof.

22. A power conversion apparatus comprising a power module part having semiconductor elements for power control, and a control part for controlling operation of the semiconductor elements, the power module part including a conductive member, a plurality of the semiconductor elements, a plurality of insulating substrates mounted respectively thereon with the semiconductor elements and provided on the conductive element, a plurality of output terminals each electrically connected to the associated two of the semiconductor elements and provided on and electrically insulated from the conductive member, a plurality of input terminals each having a positive side conductor electrically connected to one of the associated two of the semiconductor elements, and a negative side conductor electrically connected to the other of the associated two of the semiconductor elements, the positive side conductor and the negative side conductor being stacked one upon another while they are electrically insulated from each other, and being provided on and electrically insulated from the conductive member, and the plurality of insulation substrates, the plurality of output terminals and the plurality of input terminals being arranged on the conductive member so as to array the insulation substrates and the terminals in a checkered pattern.

23. A power conversion apparatus comprising a power module part having semiconductor elements for power control, and a control part for controlling operation of the semiconductor elements, the power module part including a conductive member, a plurality of the semiconductor elements, a plurality of insulating substrates mounted respectively thereon with the semiconductor elements, and provided on the conductive member, a plurality of output terminals each electrically connected to the associated two of the semiconductor elements, and provided on and electrically insulated from the conductive member, a plurality of input terminals each having a positive side conductor electrically connected to one of the associated two of the semiconductor elements, and a negative side conductor electrically connected to the other of the associated two of the semiconductor elements, the positive side conductor and the negative side conductor being stacked one upon another while they are electrically insulated from each other, and being provided on and electrically insulated from the conductive member, and the plurality of insulating substrates, the plurality of the output terminals and the plurality of input terminals being arranged on the conductive member so as to form loop-like current paths each composed of one of the input terminals, two of the semiconductor elements and one of the output terminals.

24. A power conversion apparatus comprising a power module part having semiconductor elements, and a control part for controlling operation of the semiconductor elements, the power module part including a conductive member, a plurality of the semiconductor elements, a plurality of insulating substrates mounted respectively thereon with the semiconductor elements, and provided on the conductive member, a plurality of output terminals each electrically connected to the associated two of the semiconductor elements, and provided on and electrically insulated from the conductive member, and a plurality of input terminals each composed of a positive side conductor electrically connected to one of two the associated two of the semiconductor elements and a negative side conductor electrically connected to the other of the associated two of the semiconductor elements, and the positive side conductor and the negative side conductor being stacked one upon another while they are electrically insulated from each other, and being provided on and insulated from the conductive member, and the plurality of the insulating substrates, the plurality of output terminals, the plurality of input terminals being arranged on the conductive member so as to array the insulating substrates and the terminals in a checkered pattern, and to form loop-like current paths each composed of one of the input terminals, and two of the semiconductor elements and one of the output terminals.

* * * * *